United States Patent [19]

Lin

[11] Patent Number: 5,192,927

[45] Date of Patent: Mar. 9, 1993

[54] MICROSTRIP SPUR-LINE BROAD-BAND BAND-STOP FILTER

[75] Inventor: Jau-Huei Lin, Taichung, Taiwan

[73] Assignee: Industrial Technology Research Institute, Hsinchu, Taiwan

[21] Appl. No.: 725,494

[22] Filed: Jul. 3, 1991

[51] Int. Cl.⁵ .......................................... H01P 1/203
[52] U.S. Cl. ................................ 333/204; 333/246
[58] Field of Search .............. 333/202, 204, 205, 219, 333/238, 246, 263

[56] References Cited

U.S. PATENT DOCUMENTS

| | | | |
|---|---|---|---|
| 4,074,214 | 2/1978 | Archholzer | 333/219 X |
| 5,015,976 | 5/1991 | Saka | 333/204 |

FOREIGN PATENT DOCUMENTS

| | | | |
|---|---|---|---|
| 0678562 | 8/1979 | U.S.S.R. | 333/204 |
| 2153155 | 8/1985 | United Kingdom | 333/204 |

OTHER PUBLICATIONS

Bates, "Design of microstrip spur-line band-stop filters", Microwaves, optics of Acoustics, vol. 1, No. 6, Nov. 1977, pp. 209-214.

*Primary Examiner*—Robert J. Pascal
*Assistant Examiner*—Seung Ham
*Attorney, Agent, or Firm*—H. C. Lin

[57] ABSTRACT

This invention discloses a band-stop filter, which has multiple sections of non-uniform and unbalanced microstrip transmission line. Such a structure can optimize the characteristics and maximize the matching frequency range. The total length of the filter can be reduced to a half of that of a conventional filter, and the insertion loss in the pass-band is reduced to a third of that of a conventional filter. Besides, this invention suggests a structure which does not require the inward etching of the microstrip line. Instead, the microstrip line itself is used directly as the building element of a spur-line filter. Thus, the tolerance in fabrication can be greatly relaxed without effecting the required characteristics.

12 Claims, 5 Drawing Sheets

MICROSTRIP SPUR-LINE BROAD-BAND BAND-STOP FILTER

BACKGROUND

This invention relates to microwave filters.

A spur-line filter is constructed of microstrip transmission lines. Conventional spur-line filter is a 50-ohm line with uniform and symmetric in-line etching. However, this technique has very narrow design tolerance. It is often very difficult to achieve an optimum design.

A conventional microstrip filter has a structure as shown in FIG. 1(a). The bottom part is a grounded metallic layer 1. Above the metallic layer 1 is a dielectric plate 2 with a thickness h and a relative dielectric constant $\epsilon_r$. On top of the dielectric plate 2 is a microstrip line 3 with length L and a width W. FIG. 1(b) shows the transmission characteristic of a band-stop filter, showing the insertion loss (S21) as a function of frequency. The insertion loss transmission coefficient S21 can be defined as the ratio of the filter output $b_2$ and the filter input $a_1$, expressed in dB as $20 \log(b_2/a_1)$ (dB). Therefore 0 dB indicates zero loss and ordinary insertion loss of a passive filter has a negative dB value. An ideal filter has maximum loss in the stop-band, minimum loss in the pass-band and a minimum transition region.

R. N. Bates showed several structures of a spur-line filter in a paper, "Design of microstrip spur-line band-stop filters" in Microwaves, Optics and Acoustics, Vol. 1, No. 6, pp. 209-214, November 1977, as shown in FIGS. 2(a) to 2(e). The filter consists of a coupled pair of microstrip lines, a quarter wavelength long (referred to the stop-band center frequency), with an open circuit at the end of one of the coupled lines and both lines connected together at the other end. The original construction was based on using a tuning open stub 7 to adjust the characteristics, as shown in FIG. 2(a). Subsequently, an L-shaped structure was proposed as shown in FIG. 2(b). An inverted L-shaped transmission line section 4, a quarter wavelength long, was placed beside a 50-ohm transmission line 3 to produce resonance. If any signal appearing at the 50-ohm line has a quarter wavelength nearly equal to the L-shaped section 4, the signal resonates with the L-shaped section 4 and cannot be transmitted through. Thus, the L-shaped section serves as a frequency trap like a series tuned circuit. The shorter portion 5 of the L section served as an open stub to tune the circuit. However, this structure did not perform well in terms of selectivity. Then, the structure as shown in FIG. 2(c1) was developed. The feature was that an open, L-shaped groove 6 was etched into a 50-ohm microstrip line. The equivalent circuit is shown in FIG. 2(c2), in which the open circuit section has an equivalent characteristic impedance Z1, the closed circuit section a has an equivalent characteristic impedance Z12, and $\theta$ is the electrical length. These two characteristic impedances are functions of the line width, dielectric layer thickness, dielectric constant and coupling coefficient. Finally, Bates added mirror structures symmetrically as shown in FIG. 2(d), and in the cascaded structure as shown in FIG. 2(e), similar to a double tuned circuit to increase the selectivity and broadend the stop-band width. As pointed out in his paper, the FIG. 2(e) structure yielded better results. One can see that the resultant characteristics, as shown in FIG. 3(a) had a pass-band loss of −1.5 dB to −2 dB, but a stop-band of only 1 GHz, which is not wide enough. The last two spur-line filters evidently utilized two sections of symmetrical, uniform open-circuit stubs to adjust for the required characteristic.

Hiroshi Saka et.al. also suggested another spur-line filter structure, as described in the paper, "A 12 GHz Very Small Low-Noise Converter Using InGaAs HEMT Monolithic MIC Technology", in The 3rd Asia-Pacific Microwave Conference Proceedings, Tokyo, 1990, pp.677-680. They further added two more sections to the cascaded structure with cascaded, symmetric and uniform open-circuit matching stubs 10, 11 as shown in FIG. 2(f) to effectively couple four tuned circuits together. Otherwise, the structure is similar to Bates'. The resultant characteristics are shown in FIG. 3(b). It can be seen that the pass-band loss is reduced to −1 dB to −2 dB, and the stop-band is widened to approximately 3 GHz.

The two foregoing types of spur-line filters have certain features in common. They all used open-circuit matching sections, having uniform, symmetric structures, i.e. they are all tuned to the same resonant frequency. Such structure limits the matching space, and, thus, cannot yield the optimum design.

SUMMARY

The object of this invention is to overcome the shortcomings of the conventional uniform, symmetrical filter structure. Another object of this invention is to broaden the matching range of the filter. Still another object of this invention is to reduce the loss in the transmission band and the physical size of the filter. A further object of this invention is to increase the fabrication tolerance of the transmission line width.

These objects are achieved by using multiple sections of non-uniform and asymmetric coupled microstrip trnasmission lines. This invention also introduces a new structure, which does not requires any etching into the microstrip line, thus increasing the tolerance to within ±76 um and yet retaining all the required electrical characteristics.

BRIEF DESCRIPTION OF THE DRAWINGS

FIG. 2(c2) shows the equivalent circuit of the spur-line filter shown in FIG. 2(c1).

DETAILED DESCRIPTION OF THE PREFERRED EMBODIMENT

The principle of this invention is to use multiples sections of nonuniform and asymmetric coupled lines as the tuning stubs to operate the spur-line filter. Besides, this invention introduces a new structure which does not need any etching into microstrip lines as building elements. By these new methods, the pass-band loss is greatly reduced and the physical length of the filter is shortened to a half of original one. In addition, the fabrication tolerance of the line width is greatly increased.

Figure 4A:
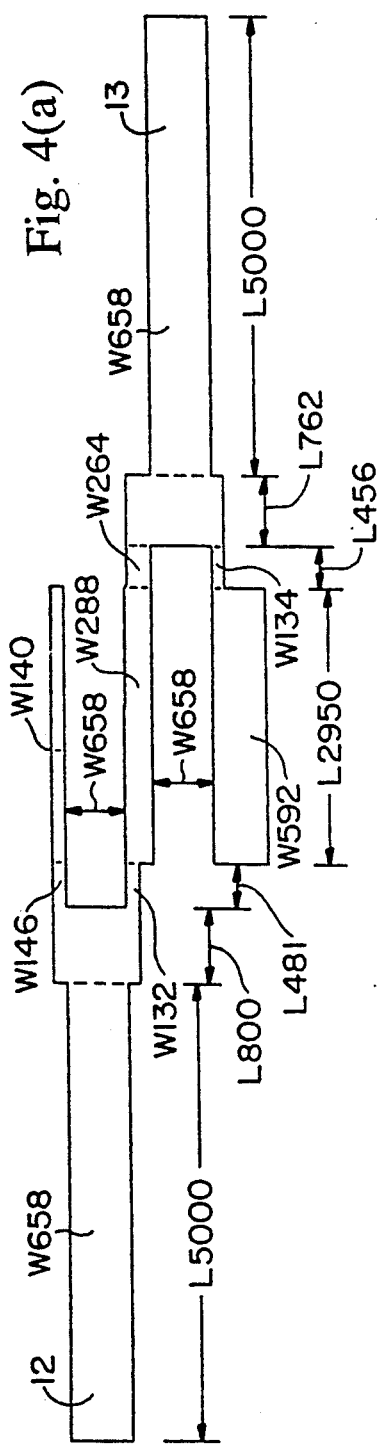
FIG. 4(a) shows the structure of spur-line filter based on this invention.
Figure 4B:
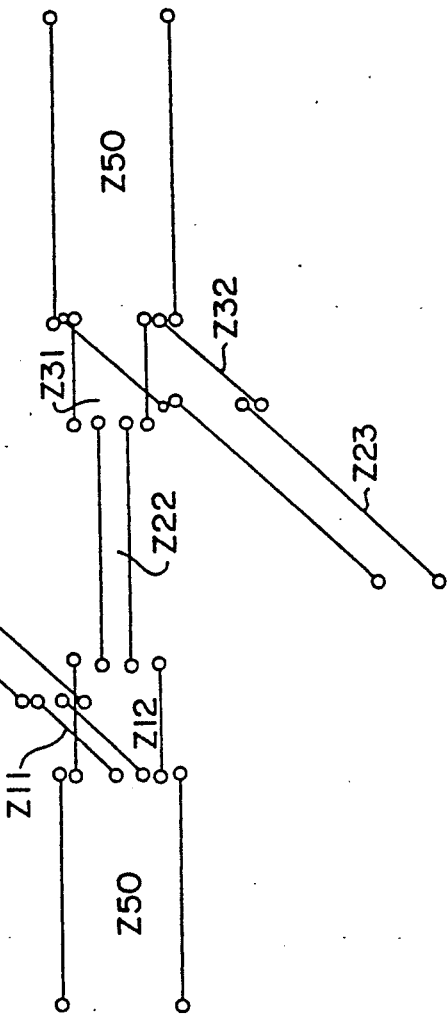
FIG. 4(b) shows the equivalent circuit of the spur-line filter shown in FIG. 4(a).

FIG. 4(a) shows the top view of a non-uniform and asymmetric microstrip line structure of this invention. As mentioned before, the metallic ground plane and the dielectric layer for supporting the metal strip lines are now shown in this figure. The circuit structure and the fabrication process of this spur-line filter will be explained in the following descriptions:

As shown in FIG. 4(a), W is the width and L is the length. The number following these letters are the optimum dimensions in micrometers (um). The strip line input section 12 and the output section 13 are both 658 um wide and 5000 um long with a characteristic impedance equal to 50 ohms. These sections are used to reduce the higher order mode waves due to the discontinuity of microstrip-to-coaxial lines in measuring. Between the input and output sections are seven sections of transmission line with unequal length. Input signal flows in from terminal 12, through W132 section, W288 section and section W264 to output terminal 13 to constitute a closed circuit section. The signal flowing through sections W146 to W140 constitutes an open circuit section. Sections W134 and W592 constitute another open circuit section. The sections W140, W288 and W592 have a length equal approximately to a quarter of the stop-band cutoff frequency wavelength, and are used to extract the frequency band signal to sections W140 and W592 and to effect a band-stop function. The spacings W658, W658 between W140 and W288, W288 and W592 are used to adjust the coupling coefficient. In short, the effective impedance of every section is determined by the width and the coupling coefficient. Thus, one can approximately sketch the equivalent circuit as shown in FIG. 4(b). The equivalent characteristic impedance of the different sections are listed as follows:

$Z_{50} \longrightarrow$ W658 section, $Z_{21} \longrightarrow$ W140 section, $Z_{31} \longrightarrow$ W264 section $Z_{11} \longrightarrow$ W146 section, $Z_{22} \longrightarrow$ W288 section, $Z_{32} \longrightarrow$ W134 section $Z_{12} \longrightarrow$ W132 section, $Z_{23} \longrightarrow$ W592 section.

Figure 1A:
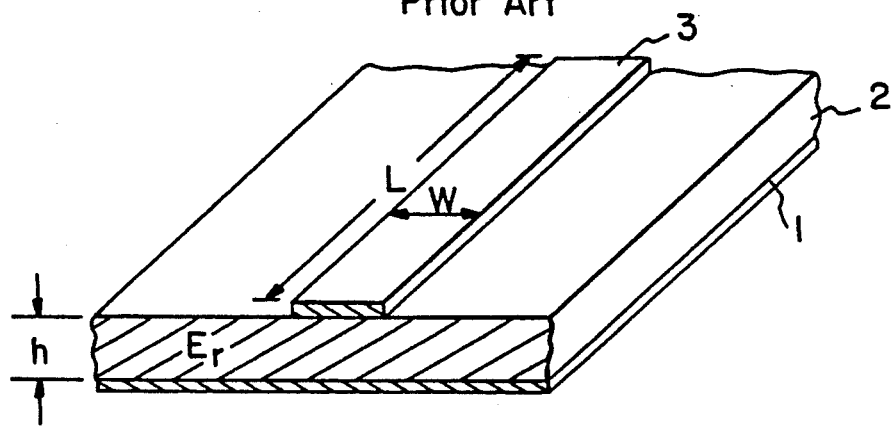
FIG. 1(a) shows the basic structure of a microstrip transmission line.
Figure 1B:
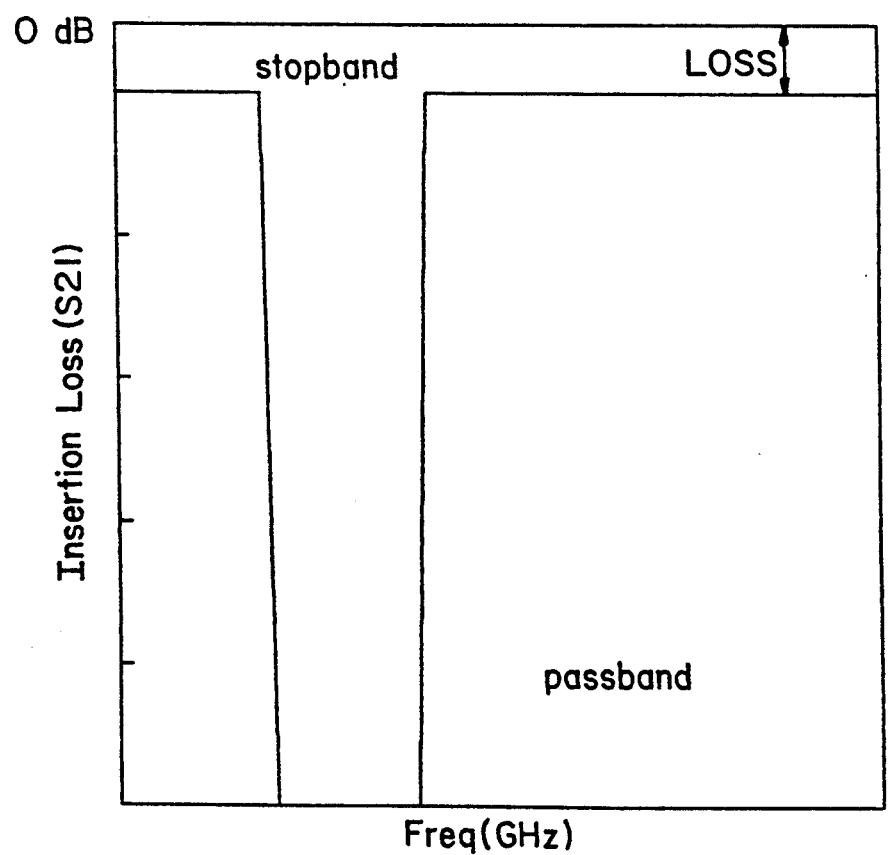
FIG. 1(b) shows the ideal characteristic of a band-stop filter.
Figure 2A:
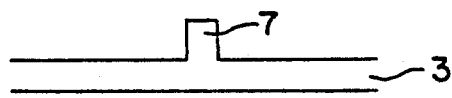
FIG. 2(a) shows the structure of a prior art spur-line filter.
Figure 2B:
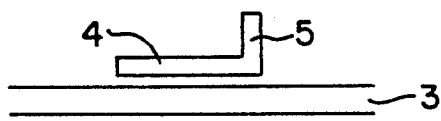
FIG. 2(b) shows a version of a prior art spur-line filter with an L-shaped stub.
Figure 2:
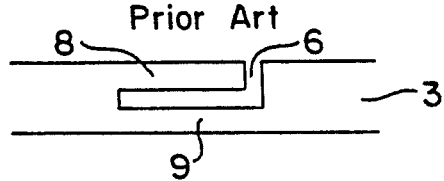
FIG. 2(c1) shows a version of a prior art spur-line filter with an inverted L-shaped groove.
Figure 2D:
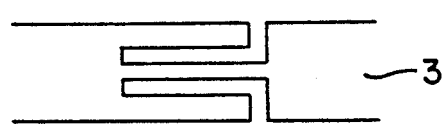
FIG. 2(d) shows a prior art spur-line filter with two symmetrical grooves.
Figure 2:
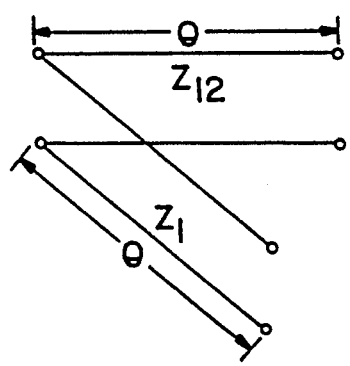
Figure 2E:
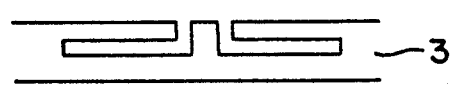
FIG. 2(e) shows a prior art spur-line filter with two symmetric, cascaded grooves.
Figure 2F:
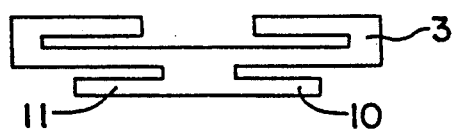
FIG. 2(f) shows a prior art spur-line filter with two symmetric L-shaped stubs and two symmetric, cascaded grooves.
Figure 3A:
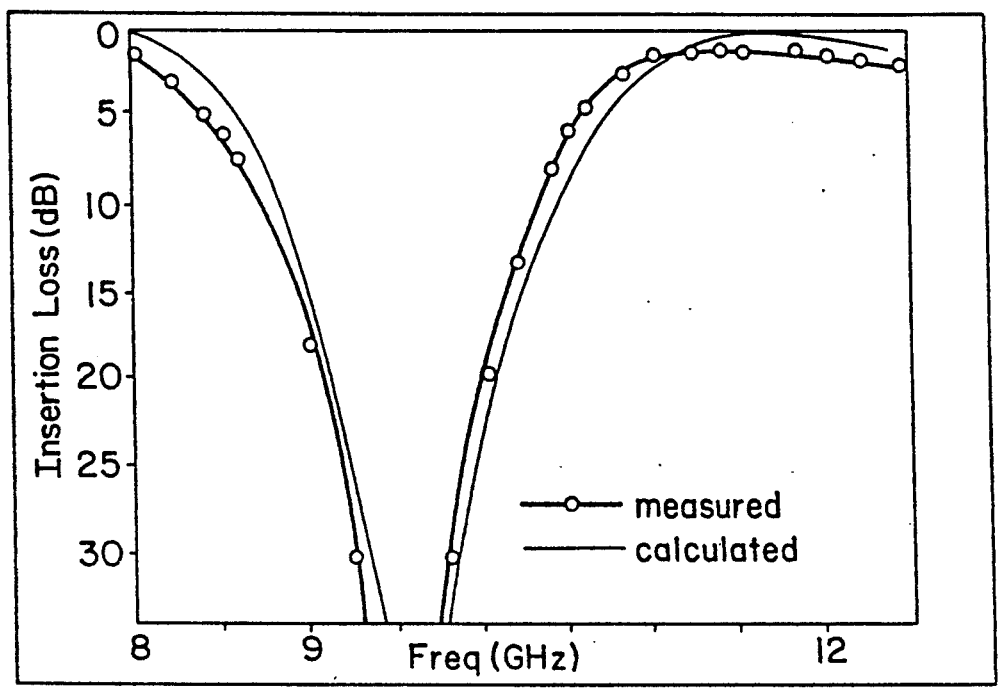
FIG. 3(a) shows the characteristic of the conventional spur-line filter shown in FIG. 2(e).
Figure 3B:
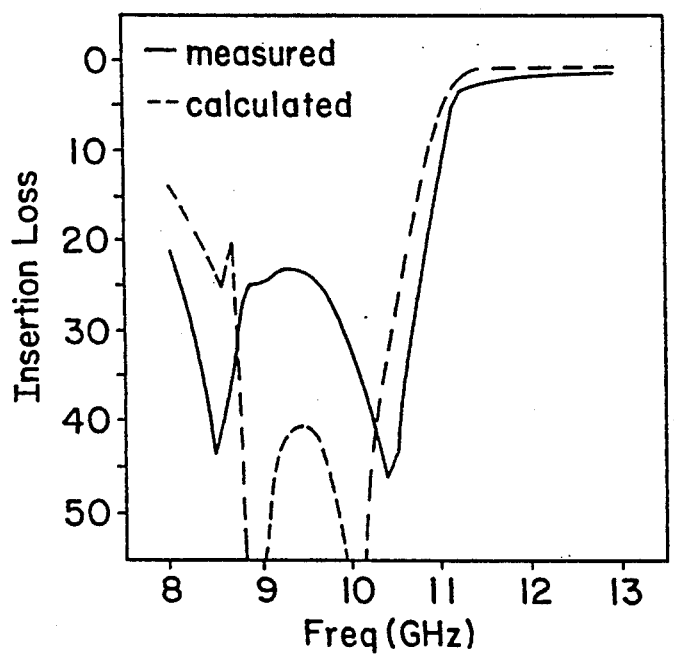
FIG. 3(b) shows the characteristics of the conventional spur-line filter shown in FIG. 2(f).

The length L of the sections shown in FIG. 4-1 are used in conjunction with these characteristic impedances to obtain the required electrical characteristics.

Figure 5A:
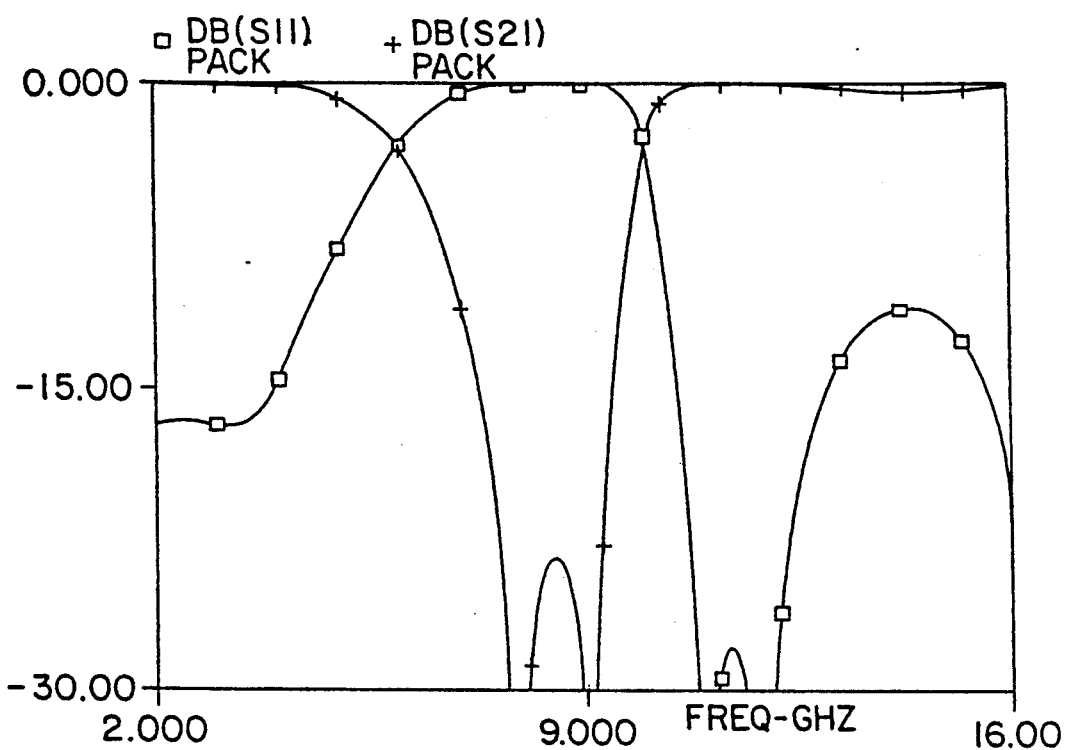
FIG. 5(a) shows the calculated characteristics of the spur-line filter, based on this invention.

In the foregoing structure, the allowable fabrication tolerance can be as much as ±76 um. In the fabrication method described below, the average error is 25 um, and the maximum error is approximately 70 um. This novel structure is capable of yielding a stop-band filter with excellent characteristic. FIG. 5(a) shows the measured characteristic of such a structure using dielectric layer of aluminum oxide with a dielectric constant $\epsilon_r$ of 10.3, and a thickness of 635 um.

Figure 5B:
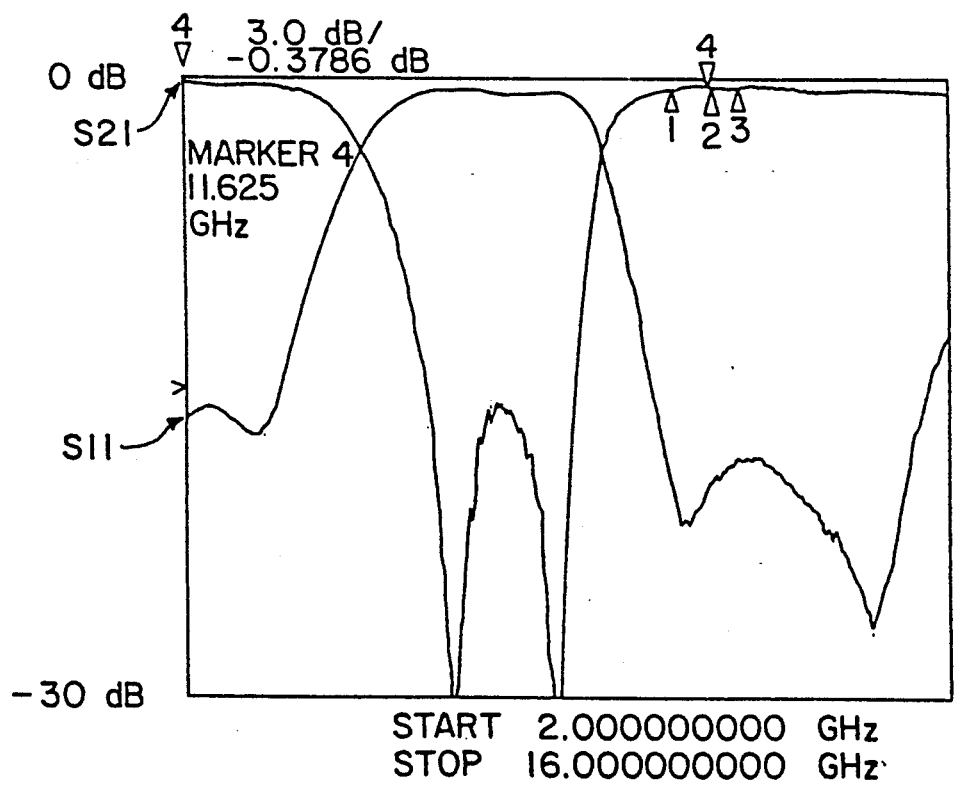
FIG. 5(b) shows the measured characteristics of the spur-line filter based on this invention.

FIG. 5(b) shows the measured characteristic of a sample of this invention. The abscissa represents frequency from 2 to 16 GHz with 1.4 GHz per division. The ordinate represents the insertion loss from 0 dB to −30 dB with 3 dB per division. From this graph, it can be seen that the stop-band width is approximately 2.8 GHz to 1.7 GHz, and the transmission coefficient varies from −16 dB to −34 dB. This graph can be compared with the theoretical model shown in FIG. 5(a). It can be seen that the insertion loss in the pass-band (10.0 to 13 GHz) is in the −0.3 dB to −0.5 dB range, which is very small.

The loss includes the following:
(a) Actual loss of the design;
(b) Insertion loss of the 1 cm long, 50 ohm microstrip line, which is twice as long as the filter;
(c) Loss due to poor contact and reflection of microstrip-to-coaxial discontinuity;
(d) Reflection due to error in the dielectric constant.

Among them, items (b) and (c) are quite significant. The predicted actual loss should be within −0.1 dB. This experiment is a proof that the characteristic of this invention is far superior to conventional structures.

Once the circuit design determines the dimensions of the different sections of microstrip line and the distance between them, the layout can be implemented by means of plotting program such as the Autocad as shown in FIG. 4(a). Then, with appropriate magnification, the design can be plotted on a plotter and cut with diamond needle on a Mylar sheet, known as Rublith, as shown in FIG. 4(a). The Rubylith has transparent and opaque areas, and is used as a mask to reduce the design on a 1:1 photographic film sheet. This film mask is used in a similar manner as in conventional printed circuit board.

The dielectric plate is composed of alumina ($Al_2O_3$), sapphire, gallium arsenide, silicon, berilium oxide (BeO), Teflon plate or printed circuit board. The dielectric plate for this circuit can be a double side 96% aluminum oxide blank. This plate is fixed in position on a base by means of a vacuum chuck. Then the foregoing mask is placed on top of the substrate and covered with gold paste. A brush is used to spread the gold paste on the dielectric plate and to form a printed pattern such as that shown in FIG. 4(a). Other conductive material such as gold alloy, silver alloy or copper alloy can also be used. The gold line has a thickness of approximately 20 um. The printed dielectric plate is baked in an oven for 30 minutes at 250° C., and then hardened in a 850° C. oven. Thus, the circuit pattern is printed on the dielectric plate. For ground connection, the foregoing process is repeated in the back side of the dielectric plate to form a ground plane.

This invention can be implemented not only with thick film technology, but also with thin film processing. The thin film technology can be implemented with higher degree of accuracy, but the cost is higher. Techniques for depositing thin film on microwave circuits can be found in the book, by Reinmut K. Hoffman, Handrook of Microwave Integrated Circuits, 1987, pages 41 to 59.

This invention discloses a near ideal stop-band filter, featuring:

(1) large stop-band attenuation,
(2) low loss in the transmission band,
(3) narrow transition band between the pass band and the stop band,
(4) short circuit length and large manufacturing tolerance.

In a weak signal system, it is highly important to have low loss in the pass-band. This invention can satisfy the requirement. This invention also suggests a microstrip line based spur-line filter, which has greater tolerance in manufacturing error, thus reducing the manufacturing cost.

The foregoing description discloses the preferred embodiment of this invention. Any variation of the structure is still within the scope of this invention.

What is claimed is:

1. A microstrip spur-line band-stop filter having microstrip coupled lines tuned to the band-stop frequencies of said band-stop filter comprising:
   three portions of microstrip transmission lines which compirse:
   an input connection for receiving a signal to be filtered,
   an output connection for outputting said signal,
   multiple sections coupled between said input connection and said output connection along a longitudinal direction and having non-uniform, asymmetric said microstrip coupled lines for filtering said signal,
   each of said non-uniform, asymmetric microstrip coupled lines having different widths in a direction transverse to the longitunal direction; said non-uniform, asymmetric microstrip coupled lines being arranged to be asymmetric about said transverse direction for obtaining said band-stop frequencies.

2. A microstrip spur-line band-stop filter as described in claim 1, wherein said multiple sections have an open-circuit section coupled with a closed circuit section.

3. A microstrip spur-line band-stop filter as described in claim 1, wherein said input connection and said multiple sections are formed in a shape of a first open-circuit section coupled with a first closed-circuit section, and said output connection and said multiple sections form a second open-circuit section coupled with a second closed-circuit section.

4. A microstrip spur-line band-stop filter as described in claim 3, wherein said first open-circuit section coupled with said first closed-circuit section is formed with unequal width of said microstrip coupled lines, and said second open-circuit section coupled with said second closed-circuit section is formed with unequal width of said microstrip coupled lines.

5. A mircrostrip spur-line band-stop filter as described in claim 1, wherein said input connection and said output connection are formed with equal width microstrip transmission lines.

6. A microstrip spur-line band-stop filter as described in claim 1, wherein said multiple sections comprise:
   a first open-circuit section connected with a first closed-circuit section section,
   a second open-circuit section connected with a second closed circuit section,
   said first open-circuit section and said first closed-circuit section having unequal width in the transverse direction and connecting to said input connection,
   said second open-circuit section and said second closed-circuit section having unequal width in the transverse direction and connecting to said output connection,
   said first closed-circuit section and said second closed-circuit section having equal width said microstrip coupled lines and coupled through another said microstrip coupled line section,
   said first open-circuit section coupled with said first closed-circuit section, and said second open-circuit coupled section with said second closed-circuit section having dimensions varied to attenuate a predetermined frequency band signal from said input connection to said output connection.

7. A microstrip spur-line band-stop filter as described in claim 6, wherein said microstrip transmission line input connection and said microstrip transmission line output connection are of equal width in the transverse direction.

8. A spur-line filter as described in claim 1, wherein said three portion of microstrip transmission lines are printed on a dielectric plate using thick film or thin film technology.

9. A microstrip spur-line band-stop filter as described in claim 8, wherein said dielectric consists of alumina ($Al_2O_3$), sapphire, galliumm arsenide, silicon, beryllium oxide (BeO), or Teflon.

10. A microstrip spur-line band-stop filter as described in claim 8, wherein said three portions of microstrip transmission lines consist of gold alloy, silver alloy or copper alloy.

11. A microstrip spur-line bandstop filter as described in claim 1, wherein each of said widths in the transverse direction has multiple steps.

12. A microstrip spur-line bandstop filter as described in claim 1, wherein said non-uniform and asymmetric microstrip coupled lines are parallel along the longitudinal direction.

* * * * *